United States Patent [19]

Haken

[11] Patent Number: 5,024,960
[45] Date of Patent: Jun. 18, 1991

[54] DUAL LDD SUBMICRON CMOS PROCESS FOR MAKING LOW AND HIGH VOLTAGE TRANSISTORS WITH COMMON GATE

[75] Inventor: Roger A. Haken, Dallas, Tex.

[73] Assignee: Texas Instruments Incorporated, Dallas, Tex.

[21] Appl. No.: 259,226

[22] Filed: Oct. 18, 1988

Related U.S. Application Data

[62] Division of Ser. No. 62,924, Jun. 16, 1987, abandoned.

[51] Int. Cl.$^5$ .................... H01L 21/265; H01L 21/336
[52] U.S. Cl. ......................................... 437/34; 437/41; 437/44; 437/57; 357/23.3; 357/42
[58] Field of Search ........................ 437/27, 28, 29, 30, 437/40, 41, 44, 34, 56, 57, 186, 233, 50; 357/23.3, 23.4, 42

[56] References Cited

U.S. PATENT DOCUMENTS

| | | | |
|---|---|---|---|
| 4,062,699 | 12/1977 | Armstrong | 437/44 |
| 4,089,712 | 5/1978 | Joy et al. | 437/44 |
| 4,172,260 | 10/1979 | Okabe | 437/44 |
| 4,318,216 | 3/1982 | Hsu | 437/41 |
| 4,578,128 | 3/1986 | Mundt | 357/23.3 |
| 4,642,878 | 2/1987 | Maeda | 437/34 |
| 4,697,332 | 10/1987 | Joy et al. | 437/41 |
| 4,722,909 | 2/1988 | Parrillo et al. | 437/44 |
| 4,760,033 | 7/1988 | Mueller | 437/34 |
| 4,808,548 | 2/1989 | Thomas et al. | 437/56 |
| 4,908,327 | 3/1990 | Chapman | 437/56 |

FOREIGN PATENT DOCUMENTS 0106166 7/1982 Japan .

OTHER PUBLICATIONS

Tsang et al., "Fabrication of High Performance LDDFETs with Oxide Sidewall-Spacer Technology", IEEE Trans. on Electron Devices, vol. ED-29, No. 4, Apr. 1982, pp. 590-596.

*Primary Examiner*—Olik Chaudhuri
*Assistant Examiner*—M. Wilczewski
*Attorney, Agent, or Firm*—James C. Kesterson; James T. Comfort; Melvin Sharp

[57] ABSTRACT

The disclosure relates to a CMOS flow process for formation of high and low voltage transistors simultaneously in a single semiconductor chip. The low and high voltage transistors share the same gate oxide thickness and the same polysilicon gate level. This is accomplished without any additional masking steps and through the use of a separate lightly doped drain for the high voltage N-channel devices. The sources of the high voltage N-channel devices are fabricated using the more heavily concentrated LDD implant normally used for the low voltage transistors. This minimizes the source resistance of the high voltage transistor which results in higher performance through improved saturated transconductance. From a high voltage capability point of view, the flow permits the realization of a single level polysilicon single gate oxide thickness low/-high voltage CMOS process.

8 Claims, 2 Drawing Sheets

DUAL LDD SUBMICRON CMOS PROCESS FOR MAKING LOW AND HIGH VOLTAGE TRANSISTORS WITH COMMON GATE

This is a division of application Ser. No. 062,924, filed Jun. 16, 1987, now abandoned.

BACKGROUND OF THE INVENTION

1. Field of the Invention

This invention relates to a CMOS method of making a high voltage and a low voltage transistor simultaneously on the same chip.

2. Brief Description of the Prior Art

Increased emphasis is presently being placed upon the merger of high voltage (i.e., about 15 volts) and low voltage (i.e., about 5 volts) functions in 1 micron and submicron CMOS. This is particularly the case for application specific integrated circuit (ASIC) standard cell type applications wherein there is a desirability of merging high performance logic cells with analog and non-volatile EPROM and EEPROM circuits.

When operating at the 1 micron and submicron CMOS technology level, merging of low and high voltage functions becomes increasingly difficult to accomplish without excessive process complexity, i.e., a large increase in the number of lithography levels. The increase in process complexity results from the use of thinner gate oxides, typically 300 angstroms or less and short channel lengths, i.e., about 0.6 to 1.2 microns, which cause severe hot electron problems in the NMOS transistors at high drain voltages (>about 5 volts). Hot electrons are high energy electrons generated in the channel region of a semiconductor device when the electric fields become excessively high. The hot electrons can then be ejected into the gate oxide and can cause reliability problems associated with the device thereby. An LDD is a well known technique to reduce the intensity of electric fields and, hence, the generation of hot electrons. As the gate length is shortened, a technique is required to reduce the hot electron generation, whereas, the higher the drain operating voltage, the greater will be the amount of hot electron generation. Therefore, it is necessary to have a different lightly doped drain structure for the high voltage transistor as compared with the low voltage device. If the same drain structure is used for both high and low voltage devices, the low voltage transistor performance is degraded, thereby requiring a trade-off as has been provided in the past.

Even long N-channel devices of about 3 microns can exhibit poor high voltage characteristics when fabricated with thin gate oxides. Similar problems are not encountered with the P-channel device because of the much lower coefficient of impact ionization for holes.

As a result of the NMOS hot electron/reliability issues, the high voltage transistor problem is usually solved by using a combination of thicker gate oxides and longer channel lengths for these devices. This usually means that two different gate oxide thicknesses have to be used in a "merged", i.e., high voltage-low voltage technology, one for low voltage/high peformance transistors and a thicker oxide for the high voltage devices. This adds significant process complexity and usually results in a two level polycrystalline silicon (polysilicon) process, the first being used for the gates of one type of transistor while the second level of polysilicon is used for the other type of transistor.

It is recognized that if it were possible for the low and high voltage transistors to share a common gate oxide thickness and therefore the same polysilicon gate electrode level, a significant reduction in process complexity could be realized. This type of structure has not been available in the prior art.

SUMMARY OF THE INVENTION

In accordance with the present invention there is provided a CMOS process flow which solves the above described problem of the prior art and wherein both low voltage/high performance logic transistors and high voltage devices share a common gate oxide thickness as well as a common polysilicon gate level, but without NMOS hot electron/reliability problems. The process for formation of both the high voltage and the low voltage devices is substantially the same except for altering the doping of the lightly doped drain (LDD) underneath the side wall oxide for the high voltage transistor without any additional masking steps.

In 1 micron and submicron CMOS technology, typical gate oxide thicknesses are in the 200 to 300 angstrom range. For the N-channel devices, the high electric fields at the drain end of the channel generate hot electrons, subsequent avalanche multiplication can result in the well known "snap back" characteristic at high drain voltages, typically 8 to 10 volts. "Snap back" takes place when avalanche multiplication occurs, the device going basically into a negative resistance mode and normally being destroyed. Since "snap back" can destroy the N-channel transistors, it is common practice to use longer channel lengths and thicker gate oxides for high voltage applications.

However, the intrinsic dielectric strength of a 200 angstrom gate oxide, typically 10 megavolts/centimeter, is adequate to support constant 10 to 12 volt operation. That is, 200 angstrom gate oxide P-channel devices have typically satisfactory characteristics beyond 12 volts. A solution to the poor high voltage handling capability of the N-channel device at short gate lengths and thin gate oxides is therefore to use an LDD so as to reduce the high electric fields and therefore reduce hot electron generation.

Unfortunately, in a CMOS process that incorporates high performance 5 volt logic transistors, separate LDDs for logic and high voltage transistors can result in an excessive number of mask levels and/or a degradation in the performance of the low voltage logic transistors due to excessive source/drain resistance. In addition, the very light LDD required to realize high voltage capability seriously degrades the performance of the high voltage transistors, because the very light LDD also enters the source region.

In the following CMOS process flow, no extra mask levels are used to realize high voltage N-channel transistor capability, no degradation in the performance of the logic transistors occurs and both devices share a common gate oxide thickness in the 200 to 350 angstrom range. In addition, the lower concentration high voltage LDD only appears at the drain terminal of the high voltage transistors and not at the source thereof (the source having been also undesirably lightly doped in the prior art), the more highly doped low voltage LDD being used at the source terminal. This minimizes the source resistance and hence improves the performance (saturated transconductance) of the high voltage transistors.

The process steps in accordance with the present invention comprise formation of a P− epitaxial layer over a P+ substrate with subsequent formation of a P− well and an N− tank adjacent thereto as in any typical MOS structure. Field oxide is grown by LOCOS procedures, which are well known, and gate oxide of about 200 to 350 angstroms is then formed in the moat or active region by thermal oxidation and is of uniform thickness in all regions, to define the field and moat regions. A polysilicon gate is formed over the gate oxide by standard masking and deposition techniques to define source and drain regions between the gate and the field oxide. An unmasked high voltage LDD implant of N-type impurity, preferably phosphorous, is then deposited over the substrate in a concentration in the range of $1 \times 10^{12}$ to $1 \times 10^{13}/cm^2$ and preferably about $4 \times 10^{12}/cm^2$. This implant enters the source/drain regions of the N-channel and P-channel transistors and is self-aligned to the polysilicon gate edge.

The next step is to provide the lightly doped drain for the high voltage N-channel transistors. This is accomplished by keeping impurity out of the drain region of the high voltage transistor. Therefore a normal N+ source/drain mask is used for this purpose and with additional N-type impurity implanted into the N-channel devices except for the high voltage transistor drain thereof in a concentration range of from about $8 \times 10^{12}$ to about $2 \times 10^{14}/cm^2$ and preferably $2 \times 10^{13}/cm^2$ to provide the low doping density in said drain. A side wall oxide is then formed along the side walls of the polysilicon gates by placing about a 3000 angstrom layer of oxide over the entire slice and then anisotropically etching the oxide back to leave the side wall oxide.

The side wall oxide provides a mask over the lightly doped drain regions. At this time the drain of the N-channel high voltage transistor is more lightly doped than the remaining N-channel transistor source/drain regions and doped the same as the P-channel transistor source/drain regions. It should be understood that the impurity presently in the P-channel devices is not desired, but is easily neutralized in subsequent processing steps, as will be explained hereinbelow. The next step is to provide a very heavy N+ implant, preferably an arsenic plus phosphorous N+ implant for source/drains. This is accomplished by placing an N+ source/drain mask over the P-channel transistors and then implanting from about $1 \times 10^{15}$ to about $6 \times 10^{15}/cm^2$ arsenic and preferably $3 \times 10^{15}/cm^2$ in addition to from about $1 \times 10^{14}$ to about $2 \times 10^{15}/cm^2$ and preferably $4 \times 10^{14}/cm^2$ of phosphorous. This implant is self-aligned to the edges of the side wall oxide and is prevented from entering the P-channel devices. The N+ source/drains of the N-channel high voltage and low voltage transistors have therefore now been formed.

The P+ source/drains for the P-channel devices are formed by masking the N-channel devices with a P+ mask and then implanting a P+ impurity, preferably boron, in a concentration range of from about $1 \times 10^{15}$ to about $6 \times 10^{15}/cm^2$ and preferably $3 \times 10^{15}$. This concentration is sufficient to counterdope the previously implanted phosphorous in the P-channel source/drain regions and provide additional impurity for a P+ region. The standard source/drain anneal is then performed to activate the implant and drive in the junctions to their final depth. In the case of the P-channel devices, the boron is penetrating under the side wall oxide and counterdoping the lighter phosphorous implant thereunder. Final standard processing, such as gate and junction silicidation, is then provided wherein titanium is deposited over the entire slice and reacted with silicon where in contact therewith, with the unreacted titanium being later removed. This provides contacts over the gate and the junctions.

DESCRIPTION OF THE PREFERRED EMBODIMENT

Figure 1:
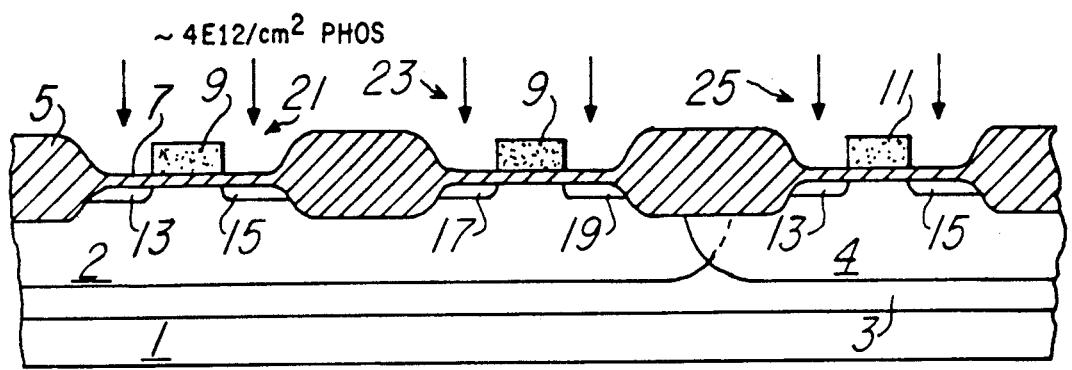
FIGS. 1 to 6 are schematic diagrams of the process flow in accordance with a preferred embodiment of the present invention.

Referring now to the FIGURES, there is shown the process flow in accordance with the preferred embodiment of the present invention. As can be seen in FIG. 1, there is provided a P+ substrate 1 of silicon having a P− epitaxial layer 3 deposited thereon in standard manner. Since a CMOS process is being applied, a P− well 2 and an N− tank 4 are formed adjacent each other and above the layer 3 and both N-channel high voltage transistors 21 and low voltage transistors 23 and P-channel high voltage transistors 25 and low voltage transistors 27 (not shown) will be formed. The field oxide 5, gate oxide 7 and polysilicon gates 9 over the N-channel transistors and 11 over the P-channel transistors are formed with exposed regions between the field oxide and the polysilicon gates for high voltage, LDD implants 13 and 15 and low voltage LDD implants 17 and 19 into all of the transistors being formed. Phosphorous in concentration of $4 \times 10^{12}/cm^2$ is then deposited over the above described unmasked substrate to provide the LDD implants at the source and drain regions of each transistor being formed.

Figure 2:
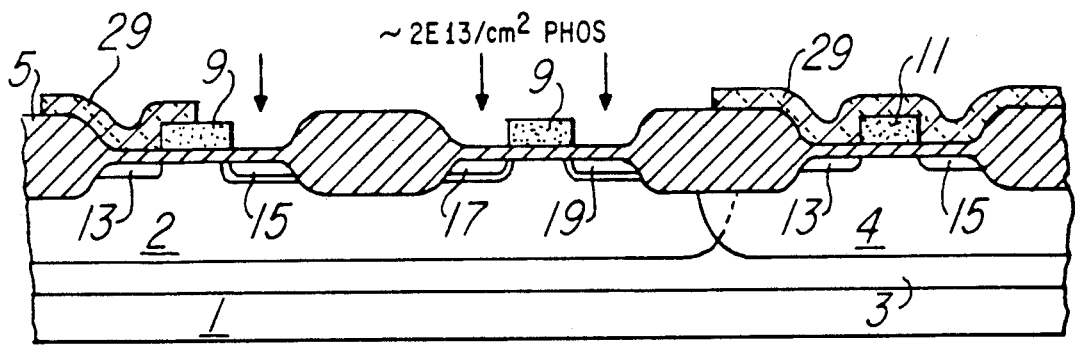
Figure 3:
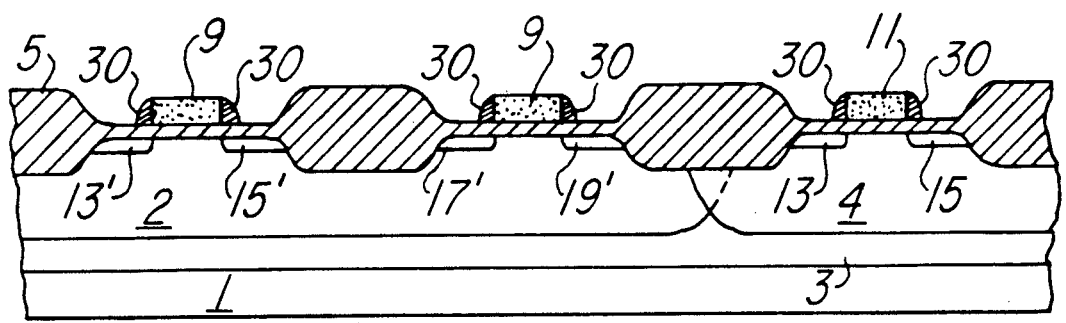

As can be seen in FIG. 2, a photoresist 29 is then formed over the drain of the high voltage N-channel transistor 21 to protect that drain region as well as over the source and drain of each of the P-channel transistors 25 and 27 with a subsequent implant of phosphorous in a concentration of $2 \times 10^{13}/cm^2$ into the source and drain regions unprotected by the photoresist. The photoresist layer 29 is then removed and an oxide layer, such as a CVD oxide, is then formed over the entire substrate and etched back in standard manner with an anisotropic etch to leave the side wall oxide 30 on the side walls of the polysilicon gates 9, as is shown in FIG. 3, due to the thicker oxide regions that form along the side walls as is well known.

Figure 4:
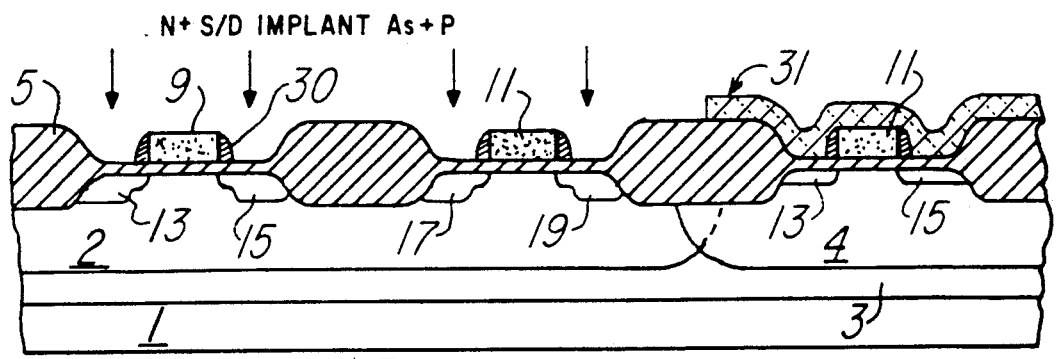
Figure 5:
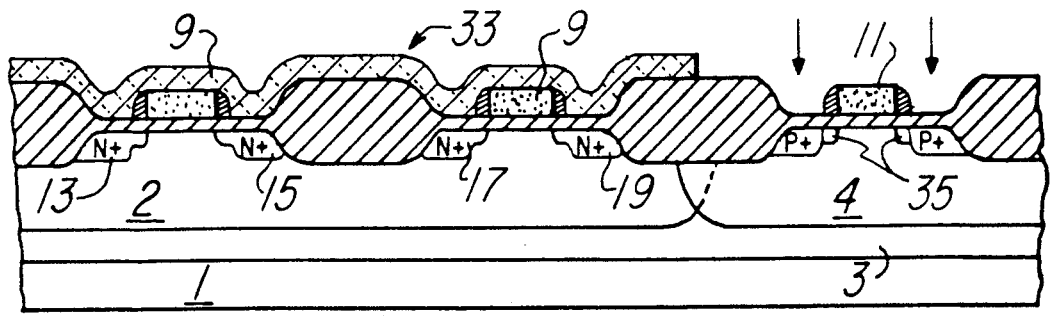
Figure 6:
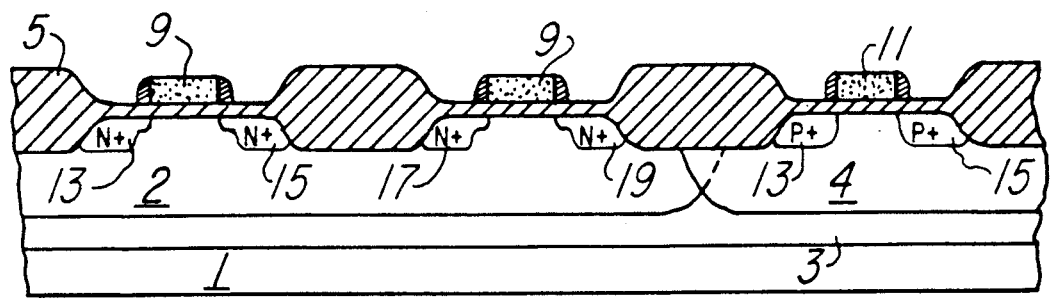

A photoresist layer 31 is then formed over the P-channel transistors 25 and 27 and and an N+ source/drain implant of a combination of arsenic in a concentration of $3 \times 10^{15}/cm^2$ and phosphorous in a concentration of $4 \times 10^{14}/cm^2$ was made in the unmasked regions as shown in FIG. 4. The result, as shown in FIG. 5, is N+ source and drain regions in the N-channel transistors 21 and 23. The photoresist layer 31 was then removed from over the P-channel transistors and a photoresist 33 was placed over the N-channel transistors with subsequent implantation of boron in a concentration of $3 \times 10^{15}/cm^2$ into the source and drain regions of the P-channel transistors 25 and 27 to provide P+ source and drain regions in those transistors with a small N+ region 35 under the side wall oxide 30 as shown in FIG. 5. The photoresist layer 33 was then removed and the substrate was annealed for 60 minutes at 900 degrees C. whereby the impurities are driven farther into the substrate, and under the side wall oxide 30, the heavy P+ boron counterdoping the light phosphorous doping under the side walls as well as in the source and drain regions to provide P+ source and drain regions in the transistors 25 and 27. The step of providing contacts to the source, drain and gate was then provided by depositing a layer of titanium over the substrate in standard manner and causing the titanium to react with silicon in contact therewith to form titanium silicide. The unreacted titanium is then removed.

It can be seen that there has been provided a procedure for simultaneous production of both high voltage and low voltage CMOS transistors on a single chip wherein the processing procedures are economical and do not require a great deal of additional operation relative to formation of one such type of transistor alone in accordance with the prior art.

Though the invention has been described with respect to a specifica preferred embodiment thereof, many variations and modifications will immediately become apparent to those skilled in the art. It is therefore the intention that the appended claims be interpreted as broadly as possible in view of the prior art to include all such variations and modifications.

I claim:

1. A method of making a CMOS integrated circuit comprising the steps of:
   providing a substrate;
   defining active regions in said substrate;
   forming a gate oxide of a selected thickness over said active regions;
   forming at least two gates over each of said active regions to define a source and drain region for a high voltage transistor and a source and drain region for a low voltage transistor;
   lightly doping each of said source and drain regions of said high voltage and low voltage transistors with an impurity of a selected type;
   doping said source regions of said high voltage and low voltage transistors and said drain region of said low voltage transistor of said active regions with additional impurity of said selected type;
   forming a sidewall oxide on each said gate; and
   further doping each of said source and drain regions of said high voltage and low voltage transistors with additional impurity of said selected type.

2. The method of claim 1 and further comprising the step of masking the drain region of said high voltage transistor immediately subsequent to said lightly doping step to protect said drain region of said high voltage transistor from a subsequent doping step.

3. A method of making a CMOS integrated circuit as set forth in claim 1, wherein each of said high voltage and low voltage transistors is N-channel.

4. A method of making a CMOS integrated circuit as set forth in claim 3 and further including the step of forming additional P-channel transistors and wherein said gate oxide associated with said high voltage and low voltage transistors is contiguous with said gate oxide associated with said additional P-channel transistors.

5. A method of making a CMOS integrated circuit comprising the steps of:
   (a) providing a substrate having a P-type region and an N-type region,
   (b) defining plural active regions in each of said P-type and said N-type regions,
   (c) forming a gate oxide over said active regions,
   (d) forming a polysilicon gate over each of said active regions to define a pair of source and drain regions in each active region,
   (e) lightly doping each of said source and drain regions with an N-type impurity,
   (f) doping both sources and one drain of each adjacent pair of active regions in each said P-type region with additional N-type impurity,
   (g) forming a side wall oxide on each said gate,
   (h) doping said P-type region only with additional N+ impurity,
   (i) doping said N-type region only with a P+ impurity, and
   (j) annealing said substrate.

6. A method as set forth in claim 5 wherein step (b) comprises formation of a field oxide.

7. A method as set forth in claim 6 wherein step (d) comprises formation of said gate over said active regions in said N-type and P-type regions simultaneously.

8. A method as set forth in claim 5 wherein step (d) comprises formation of said gate over said active regions in said N-type and P-type regions simultaneously.

* * * * *